US007109723B2

(12) United States Patent
Hsu et al.

(10) Patent No.: US 7,109,723 B2
(45) Date of Patent: Sep. 19, 2006

(54) BRIDGE TYPE PHASE DETECTION DEVICE

(75) Inventors: Cheng-Chia Hsu, Chupei (TW); Teng-Ho Wu, Yongkang (TW); Ho-Wen Chen, Taipei (TW); Teng-Kang Chang, Hsinchu (TW)

(73) Assignee: Logah Technology Corp., Hsinchu (TW)

( * ) Notice: Subject to any disclaimer, the term of this patent is extended or adjusted under 35 U.S.C. 154(b) by 0 days.

(21) Appl. No.: 11/237,931

(22) Filed: Sep. 29, 2005

(65) Prior Publication Data

US 2006/0186895 A1 Aug. 24, 2006

(30) Foreign Application Priority Data

Feb. 24, 2005 (TW) .............................. 94202894 U

(51) Int. Cl.
*G01R 27/02* (2006.01)

(52) U.S. Cl. ....................................... 324/610; 324/770

(58) Field of Classification Search ................ 324/610, 324/770

See application file for complete search history.

(56) References Cited

U.S. PATENT DOCUMENTS 4,798,988 A * 1/1989 Mitsutsuka ............. 310/313 R
6,494,587 B1 * 12/2002 Shaw et al. .................... 362/29
6,636,190 B1 * 10/2003 Hirakata et al. ........... 345/74.1

* cited by examiner

*Primary Examiner*—Walter Benson
(74) *Attorney, Agent, or Firm*—Rosenberg, Klein & Lee

(57) ABSTRACT

A bridge type phase detection device comprises one or more than one transformer, a plurality of tubes, a voltage-detecting protection circuit and a first, second and third impedance, wherein a first tube of said plurality of tubes has a phase opposite to that of a second tube of said plurality of tubes, and a first end of said first impedance coupling with a secondary side of said transformer and a first end of said first tube, a first end of said second impedance coupling with said secondary side of said transformer and a first end of said second tube, then a second end of said first impedance connecting to a second end of said second impedance to form a detection point, said detection point coupling with said third impedance and said voltage-detecting protection circuit; said detection point having a voltage value derived from calculating a sum of said phase of said first impedance and that of said second impedance, then an output voltage divided among said first, two and third impedance, resulting in approximately zero voltage at said detection point during normal operation, if said voltage-detecting protection circuit detecting a non-zero voltage, it is concluded that a tube anomaly is present.

10 Claims, 11 Drawing Sheets

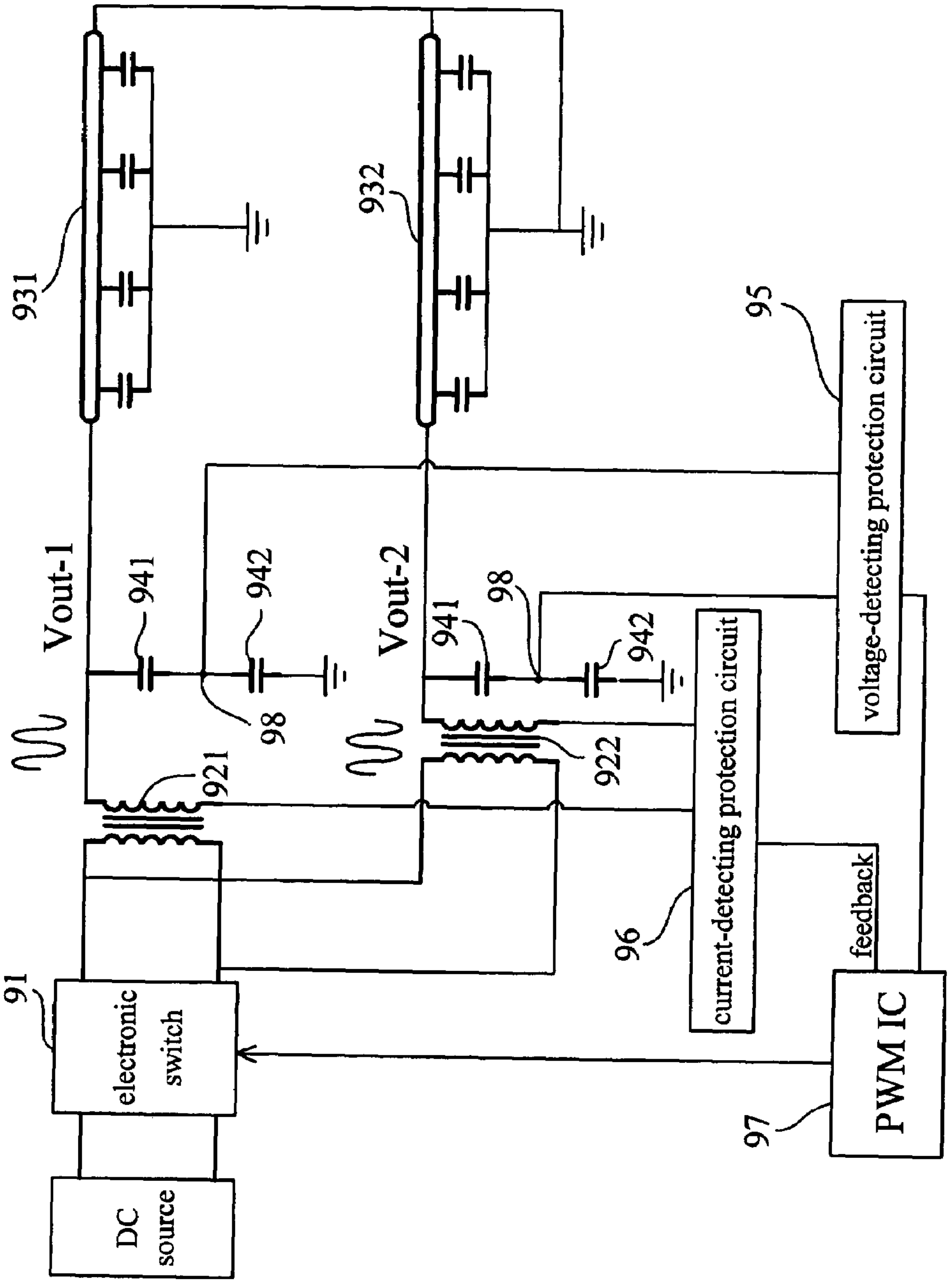
Prior Art FIG.1A

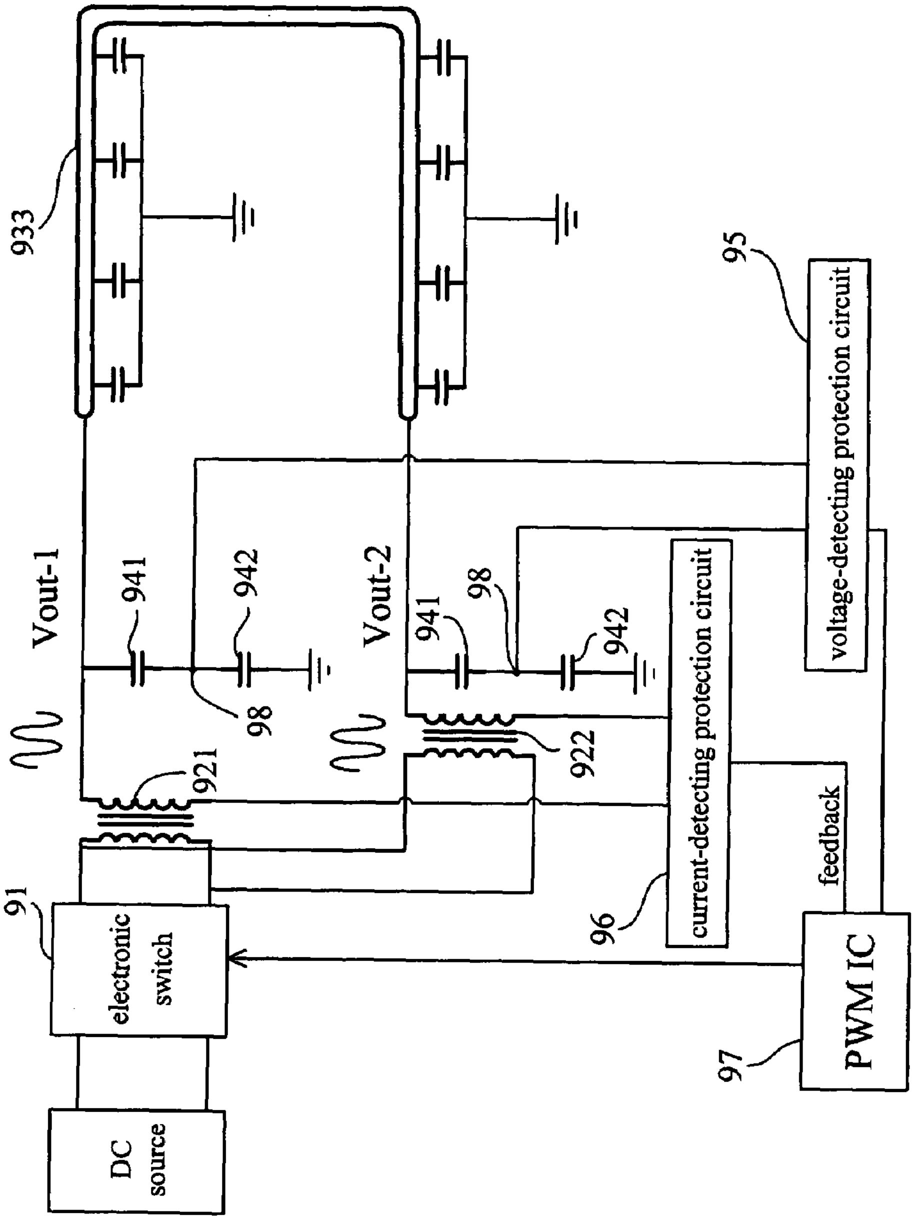
Prior Art FIG.1 B

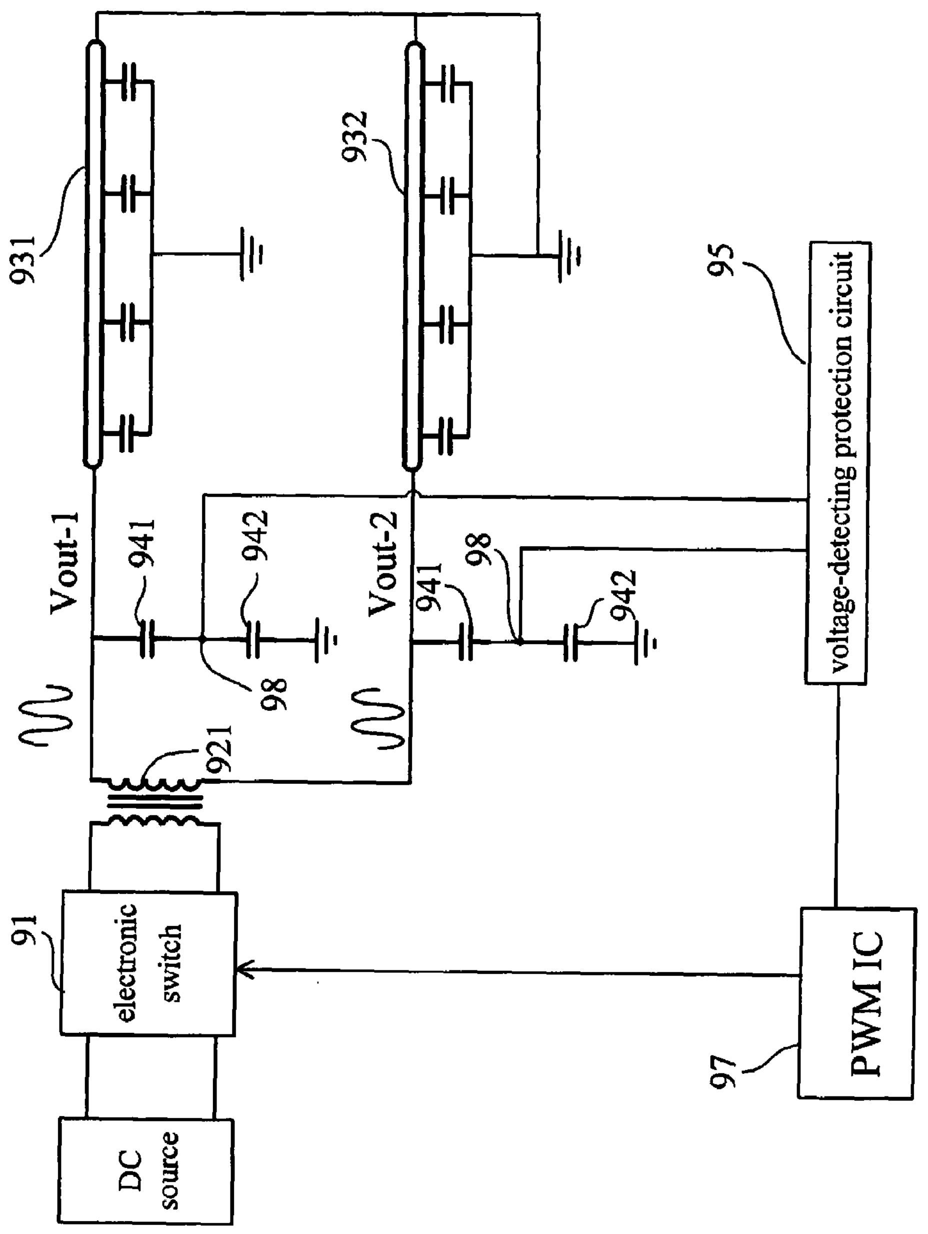
Prior Art FIG.1 C

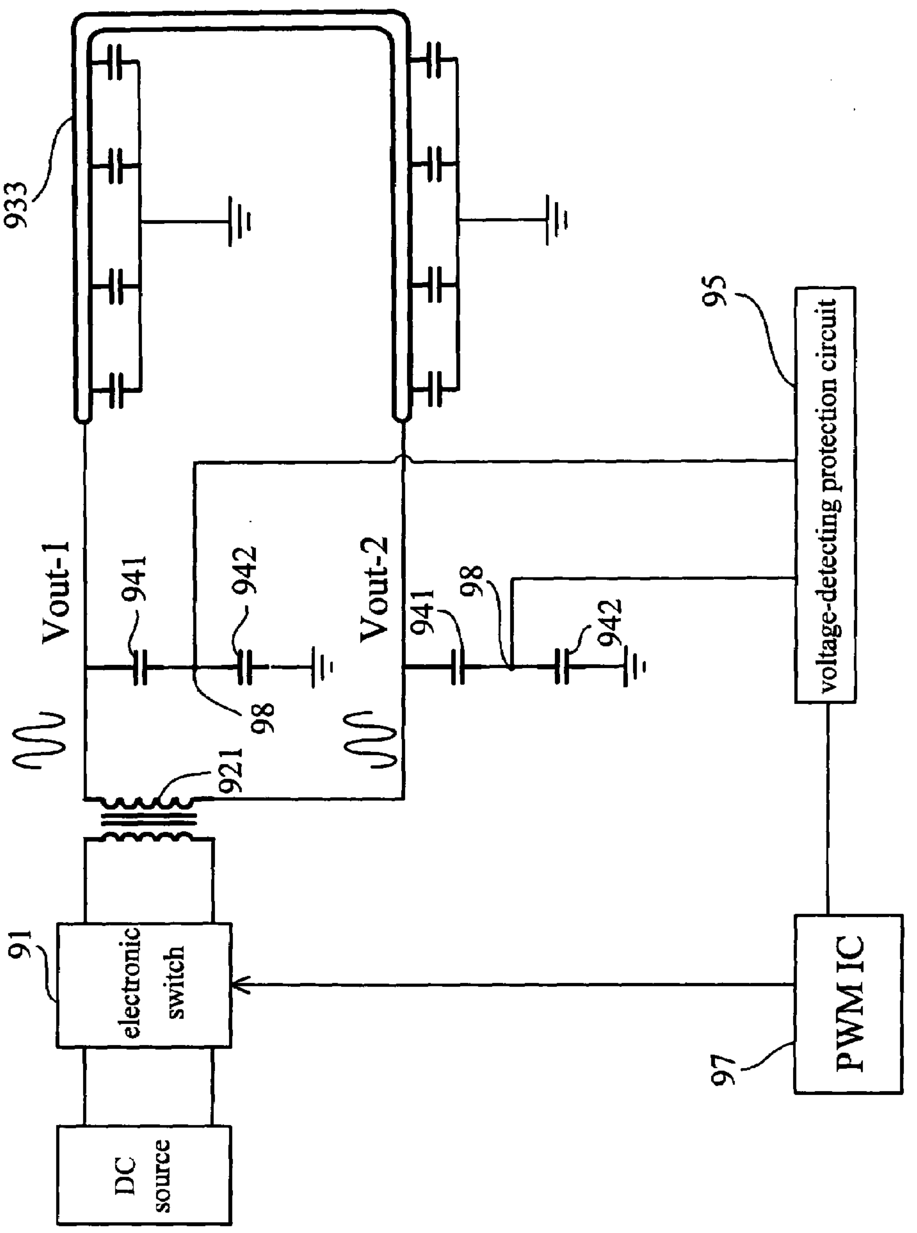
*Prior Art* *FIG.1 D*

BRIDGE TYPE PHASE DETECTION DEVICE

BACKGROUND OF THE INVENTION

1. Field of the Invention

The present invention relates to a bridge type phase detection device and more particularly, to a bridge type phase detection device which can accurately detect an anomaly of a LCD backlight tube.

2. Description of the Prior Art

FIG. 1A illustrate a prior art tube anomaly detection circuit for LCD backlight, the tube anomaly detection circuit comprising an electronic switch 91, a first and second transformer 921, 922, a first tube 931 and a second tube 932, a first and second capacitor 941, 942, a voltage-detecting protection circuit 95, a current-detecting protection circuit 96, a pulse width modulation (PWM) IC 97. PWM IC 97 and a primary side of first transformer 921 and second transformer 922 couple with the electronic switch 91, and a first end of a secondary side of first and second transformer 921, 922 couple with a first end of first and second tube 931, 932, while a second end of the secondary side of first and second transformer 921, 922 couple with current-detecting protection circuit 96; a second end of first and second tube 941, 942 are grounded, respectively, and a first end of first capacitor 941 couples with the first end of the secondary side of first and second transformer 921, 922 and the first end of first and second tube 931, 932; the second end of first capacitor 941 couples with a first end of second capacitor 942, and a second end of second capacitor 942 is grounded, the place where first capacitor 941 couples with second capacitor 942 is called a detection point 98. Detection point 98 couples with voltage-detecting protection circuit 95, and then couples with current-detecting protection circuit 96 and PWM IC 97 through voltage-detecting protection circuit 95.

In the above mentioned circuitry, voltage-detecting protection circuit 95 detects a voltage value of detection point 98 to find out if first and second tube 931, 932 operate normally; however, the voltage of detection point 98 is derived from dividing an output voltage based on the impedance of first capacitor 941 and that of second capacitor 942; therefore, the voltage is around 1000Vrms during normal operation and rises to 1200V~1300Vrms when an anomaly occurs, the difference between them is only 20%, which is not easy for voltage-detecting protection circuit 95 to detect any anomaly associated with first and second tube 931, 932.

FIGS. 1B–D illustrate a few prior art tube anomaly detection circuits for LCD backlight. In FIG. 1B, two transformers couple with U-shaped tube 933 to provide power and to detect if U-shaped tube 933 works properly; in FIG. 1C, a single transformer 921 couples with tube 931, 932 to detect if tube 931, 932 work properly; in FIG. 1D, a single transformer 921 couples with U-shaped tube 933 to detect if U-shaped tube 933 works properly; however, all of the tube anomaly detection circuits detect the divided voltage derived from first capacitor 941 and second capacitor 942, it is likely that voltage-detecting protection circuit 95 has difficulties in detecting any anomaly associated with the tubes.

Therefore, the prior art tube current control device mentioned above presents several shortcomings to be overcome.

In view of the above-described deficiency of prior-art tube anomaly detection circuit for LCD backlight, after years of constant effort in research, the inventor of this invention has consequently developed and proposed a bridge type phase detection device in the present invention.

SUMMARY OF THE INVENTION

It is an object of the present invention to provide a bridge type phase detection device, wherein a first tube has a phase opposite to that of a second tube, with a first, second and third impedance similar to two tubes being connected to form a detection point. When a non-zero voltage is detected at the detection point, it is concluded that a tube anomaly is present.

It is another object of the present invention to provide a bridge type phase detection device suitable for two or more than two tubes.

It is another object of the present invention to provide a bridge type phase detection device, wherein the first, second and third impedance are either resistor, capacitor or inductor.

The present invention discloses a bridge type phase detection device comprising an electronic switch, a pulse width modulation (PWM) IC, one or more than one transformer, a plurality of tubes, a voltage-detecting protection circuit and a first, second and third impedance; wherein a primary side of the transformer coupling with the electronic switch, a secondary side of the transformer coupling with a first end of each one of the tubes, while a second end of each one of the tubes being grounded; a first tube of the tubes has a phase opposite to that of a second tube of the tubes, and a first end of the first impedance coupling with the secondary side of the transformer and a first end of the first tube, a first end of the second impedance coupling with the secondary side of the transformer and a first end of the second tube, then a second end of the first impedance connecting to a second end of the second impedance to form a detection point, the detection point coupling with the third impedance and the voltage-detecting protection circuit, and the voltage-detecting protection circuit coupling with the PWM IC, then the PWM IC coupling with the electronic switch to form a closed circuit; the voltage-detecting protection circuit detecting a voltage value of the detection point, the detection point having the voltage value derived from calculating a sum of the phase of the first impedance and that of the second impedance, then an output voltage divided among the first, two and third impedance, resulting in approximately zero voltage at the detection point during normal operation, if the voltage-detecting protection circuit detecting a non-zero voltage, it is concluded that a tube anomaly is present.

BRIEF DESCRIPTION OF THE DRAWINGS

The drawings disclose an illustrative embodiment of the present invention which serves to exemplify the various advantages and objects hereof, and are as follows:

FIG. 1A–D illustrate a prior art tube anomaly detection circuit for LCD backlight;

DETAILED DESCRIPTION OF THE PREFERRED EMBODIMENT

Figure 2:
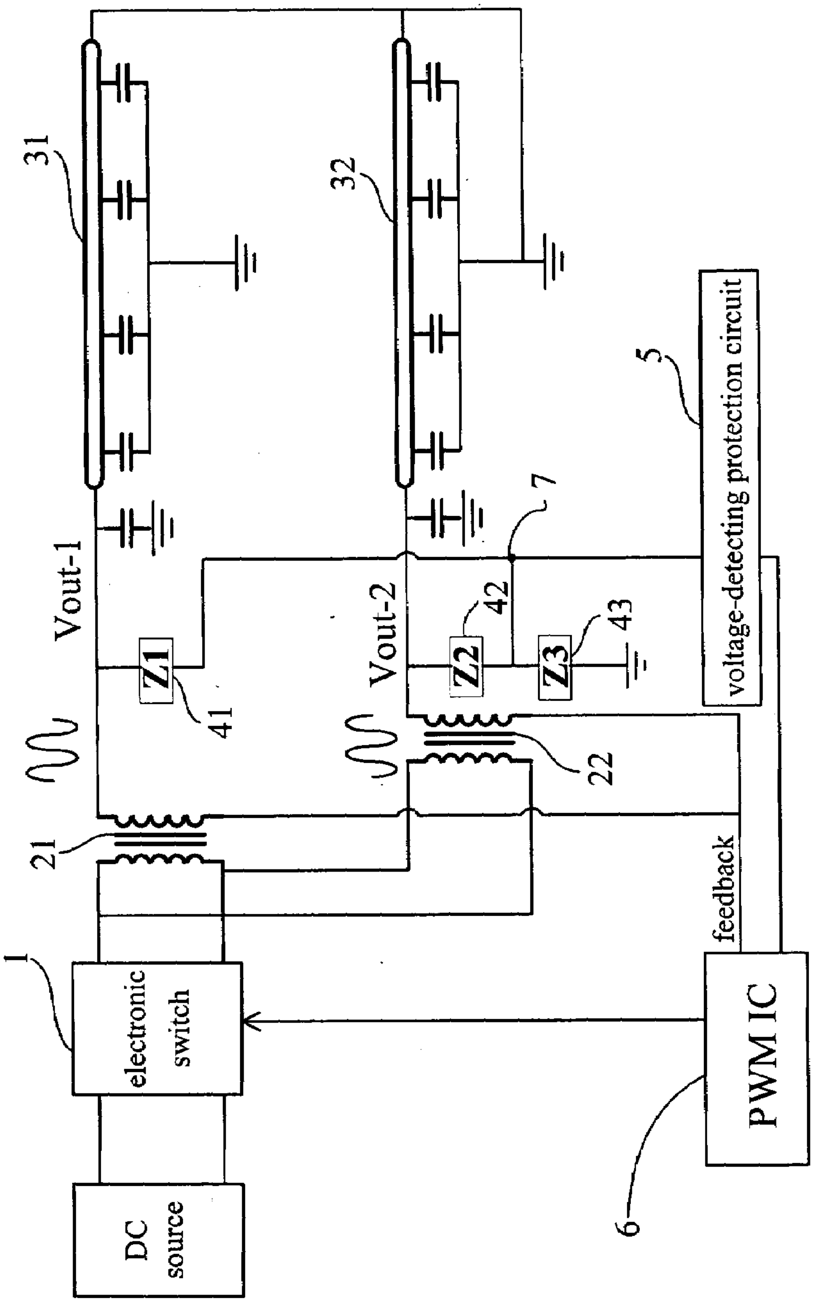
FIG. 2 illustrates a first embodiment of the bridge type phase detection device in the present invention.

Please refer to FIG. 2, which illustrates an embodiment of the bridge type phase detection device in the present invention. The bridge type phase detection device mainly comprises an electronic switch 1, a first transformer 21, a second transformer 22, a first tube 31, a second tube 32, a first impedance 41, a second impedance 42, a third impedance 43, a voltage-detecting protection circuit 5, and a PWM IC 6. Electronic switch 1 connects to a DC power source and couples with a primary side of first and second transformer 21, 22; a first end of a secondary side of first and second transformer 21, 22 couple with a first end of first and second tube 31, 32 respectively, while a second end of the secondary side of first and second transformer 21, 22 couple with PWM IC 6, and the second end of first and second tube 31, 32 are grounded; a first end of first impedance 41 couples with the first end of first transformer 21 and the first end of first tube 31, the first end of second impedance 42 couples with the first end of the secondary side of second transformer 22 and the first end of second tube 32, then a second end of first impedance 41 couples with a second end of second impedance 42 to form a detection point 7, wherein detection point 7 couples with third impedance 43 and voltage-detecting protection circuit 5, and voltage-detecting protection circuit 5 further couples with PWM IC 6, then PWM IC 6 couples with electronic switch 1 to form a detection circuit.

Figure 3A:
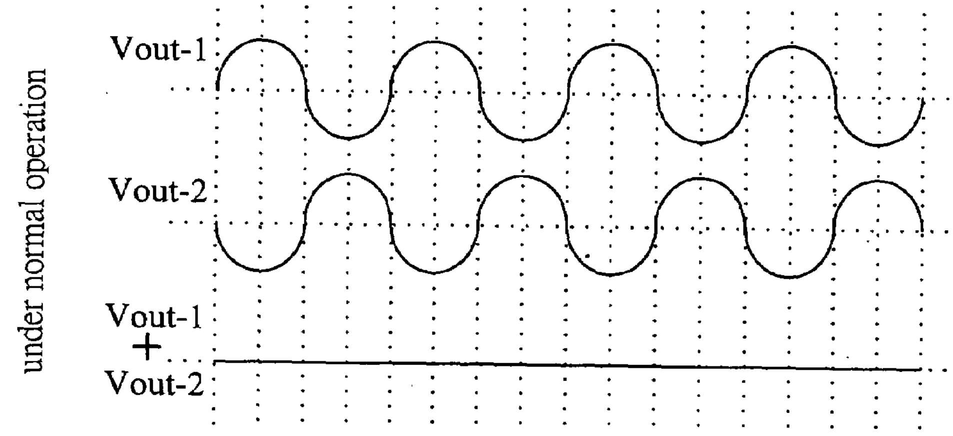
FIG. 3A shows a waveform of the bridge type phase detection device under normal operation.
Figure 3B:
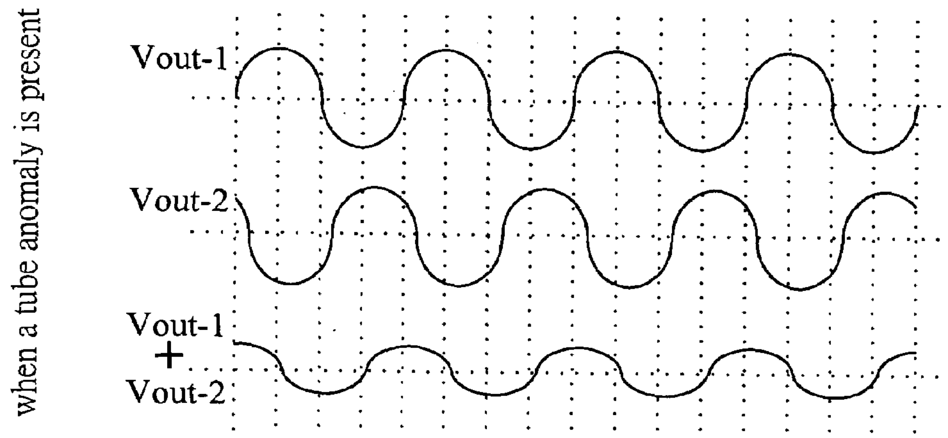
FIG. 3B shows a waveform of the bridge type phase detection device while a tube anomaly is present.

Please refer to FIGS. 3A and 3B, wherein the phase of first tube 31 is set to be opposite to that of second tube 32, and the voltage value of detection point 7 is derived from the sum of the phase of first impedance 41 and the phase of second impedance 42, since the phase difference between first and second impedance under normal operation is exactly 180 degrees, therefore the voltage value calculated based on the sum of the voltage of first impedance 41 and the voltage of second impedance 42 is approaching zero. On the other hand, the phase difference of first impedance 41 and second impedance 42 will not be exactly 180 degree if a tube anomaly should occur, then the resulted output voltage will not be zero, making it easy for voltage-detecting protection circuit 5 to detect any anomaly associated with first and second tube 31, 32.

Figure 4:
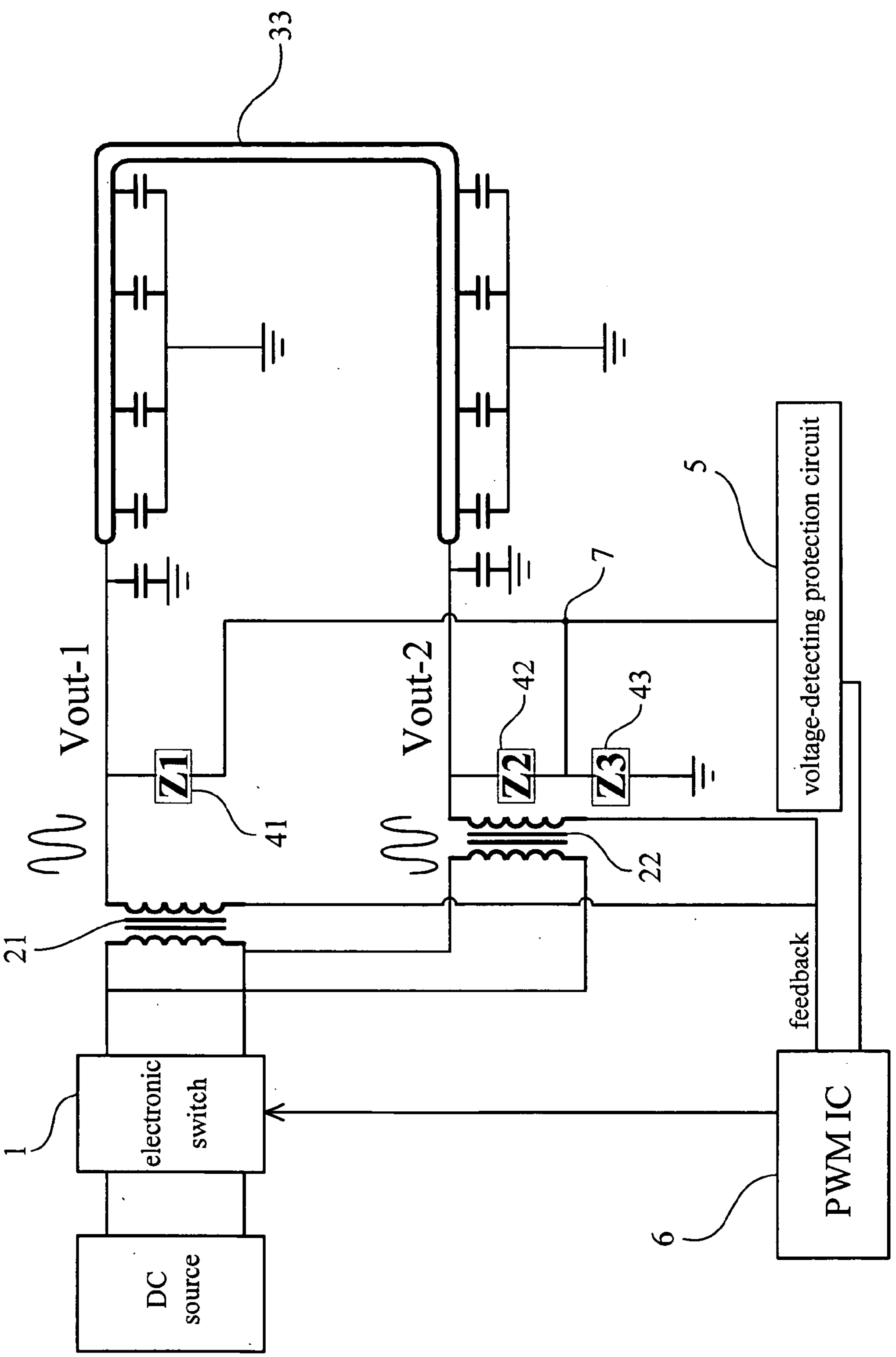
FIG. 4 illustrates a second embodiment of the bridge type phase detection device in the present invention.

FIG. 4 illustrates another embodiment of the bridge type phase detection device in the present invention, wherein first and second tube 31, 32 are replaced by U-shaped tube 33. The configuration of FIG. 4 is almost identical to that of FIG. 2, except that U-shaped tube 33 has its two end coupled with one end of the secondary side of first and second transformer 21, 22 respectively. Same as above, the phase difference between parallel tubes of U-shaped tube 33 is 180 degrees, therefore the voltage value calculated based on the sum of the voltage of first impedance 41 and the voltage of second impedance 42 is approaching zero. If a non-zero voltage is detected by voltage-detecting protection circuit 5, then an anomaly associated with U-shaped tube 33 is present.

Figure 5:
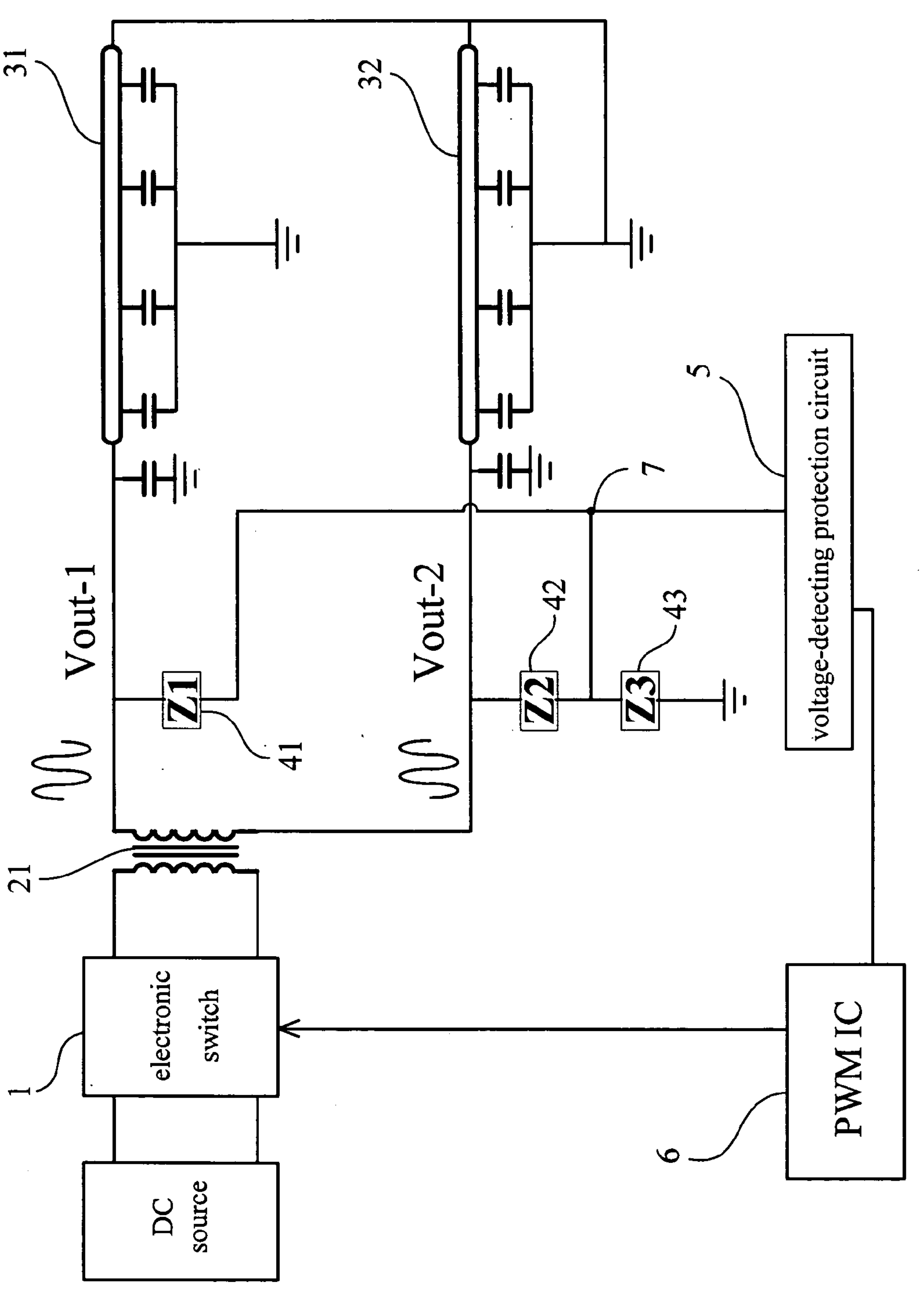
FIG. 5 illustrates a third embodiment of the bridge type phase detection device in the present invention.

FIG. 5 illustrates another embodiment of the present invention, wherein a single transformer 21 is used to drive first and second tube 31, 32. The two ends of the secondary side of transformer 21 couple with a first end of first and second tube 31, 32 respectively, and a second end of first and second tube are grounded. A first end of impedance 41 couples with one end of transformer 21 and the first end of first tube 31, a first end of second impedance 42 couples with another end of transformer 21 and the first end of second tube 32, then a second end of first impedance 41 couples with a second end of second impedance 42 to form a detection point 7, wherein detection point 7 couples with third impedance 43 and voltage-detecting protection circuit 5 to enable voltage-detecting protection circuit 5 to detect the voltage at detection point 7. Furthermore, voltage-detecting protection circuit 5 couples with PWM IC 6, then PWM IC 6 couples with electronic switch 1 to form a detection circuit. Same as above, the phase of first tube 31 is set to be opposite to that of second tube 32, and the voltage value of detection point 7 is derived from the sum of the phase of first impedance 41 and the phase of second impedance 42, then an output voltage divided among the first, two and third impedance, resulting in approximately zero voltage at the detection point during normal operation, if the voltage-detecting protection circuit detecting a non-zero voltage, it is concluded that a tube anomaly is happened to first tube 31 or second tube 32, or both.

Figure 6:
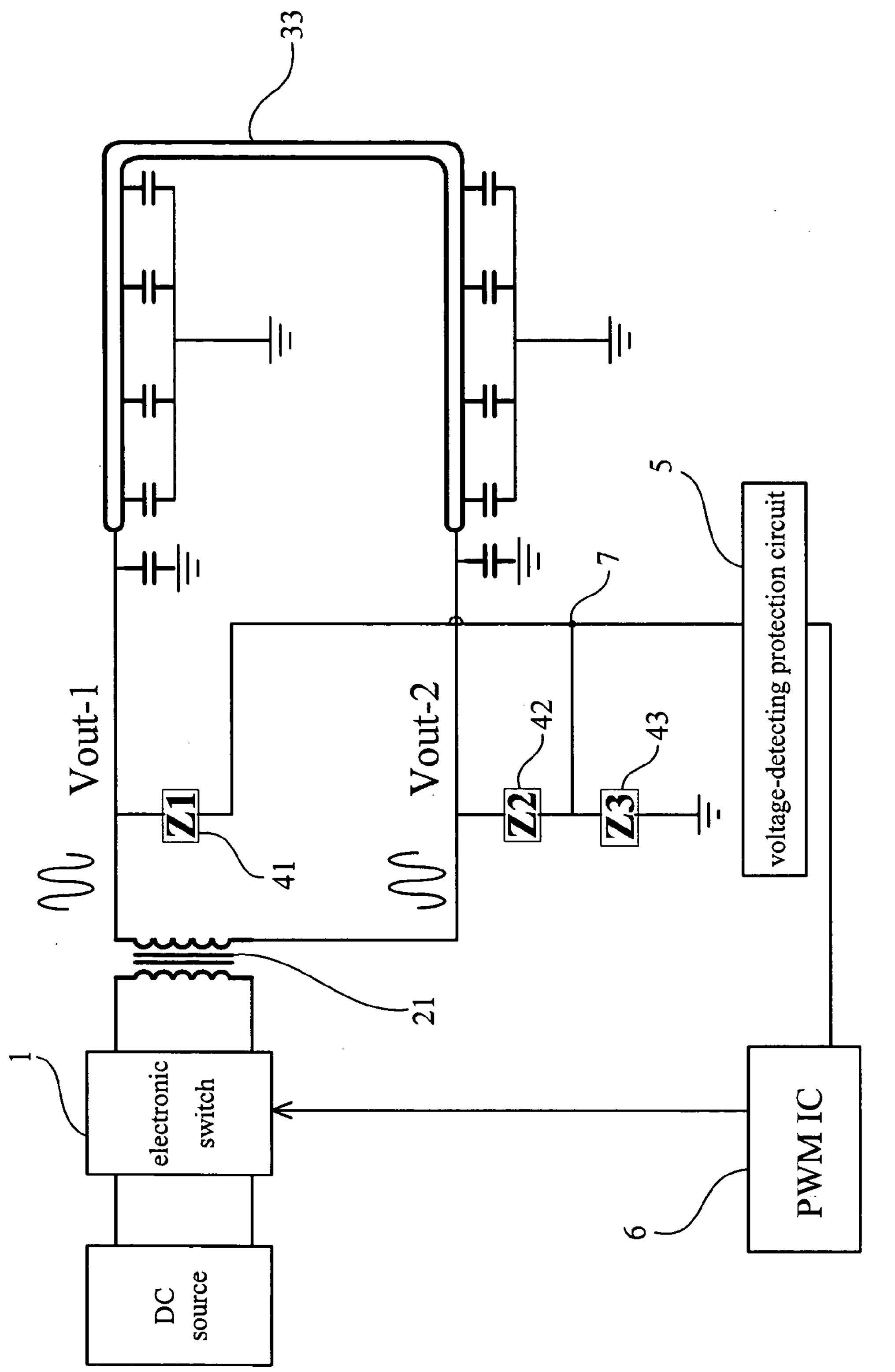
FIG. 6 illustrates a fourth embodiment of the bridge type phase detection device in the present invention.

Furthermore, FIG. 6 illustrates still another embodiment of the bridge type phase detection device in the present invention, wherein first and second tube 31, 32 in FIG. 5 are replaced by U-shaped tube 33. The configuration of FIG. 6 is almost identical to that of FIG. 5, except that U-shaped tube 33 has its two end coupled with one end of the secondary side of first and second transformer 21, 22 respectively. Same as above, the phase difference between parallel tubes of U-shaped tube 33 is 180 degrees, therefore voltage-detecting protection circuit 5 can accurately detect any anomaly associated with U-shaped tube 33.

Figure 7:
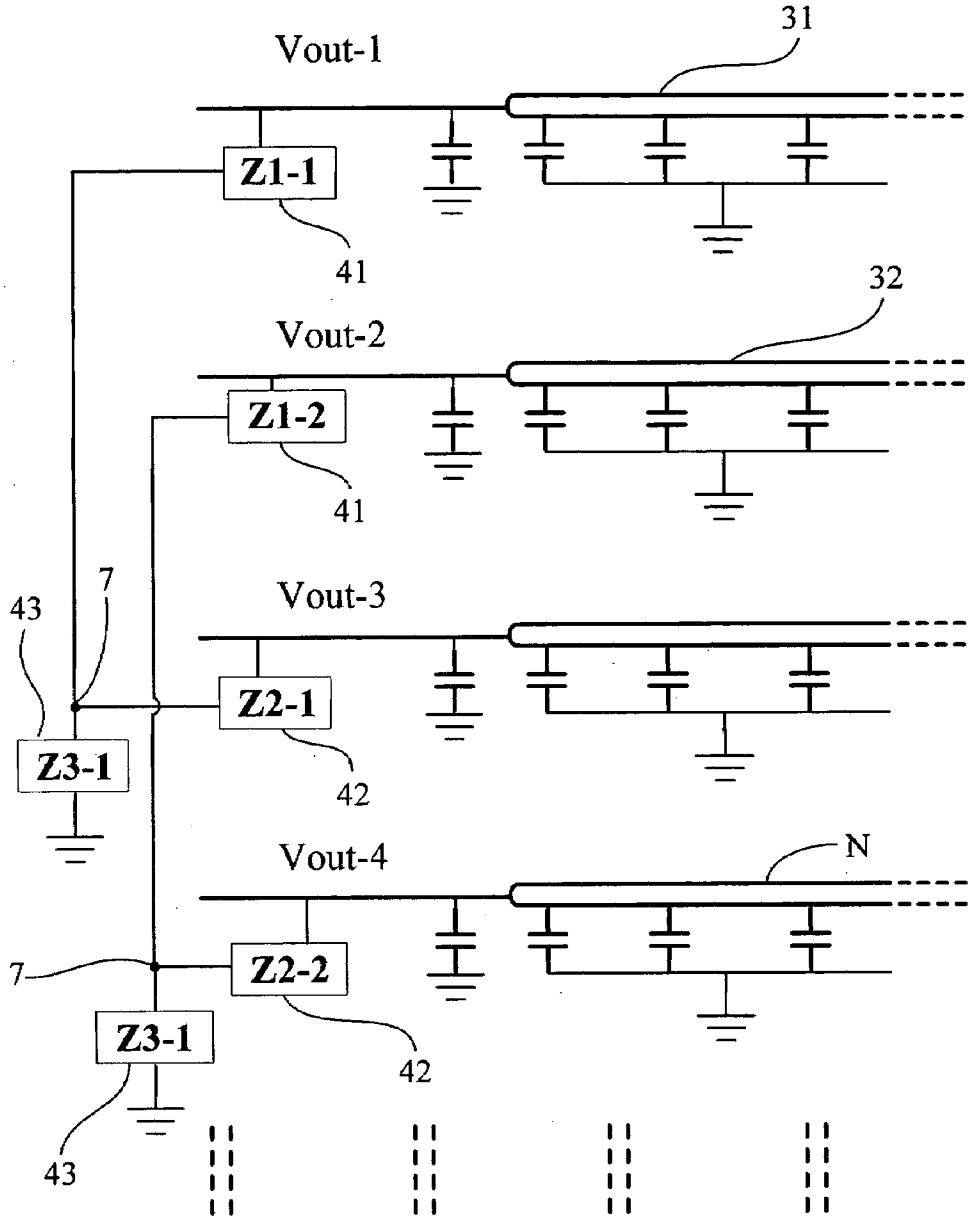
FIG. 7 illustrates a fifth embodiment of the bridge type phase detection device in the present invention.
Figure 8A:
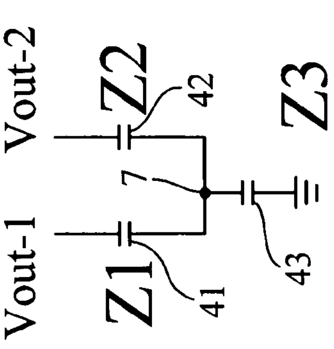
FIGS. 8A–F illustrate difference configurations of the first impedance, second impedance and third impedance of the bridge type phase detection device in the present invention.
Figure 8B:
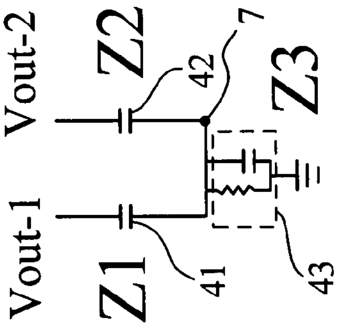
Figure 8C:
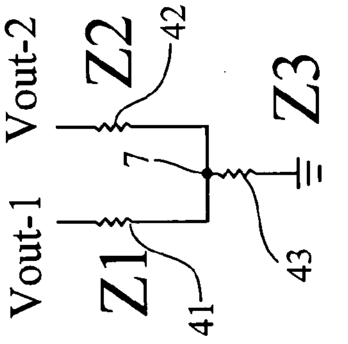
Figure 8D:
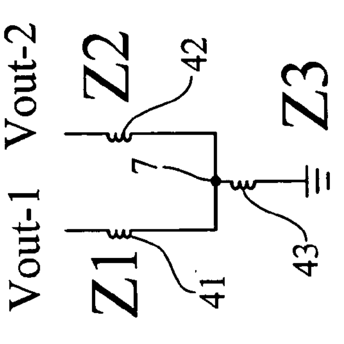
Figure 8E:
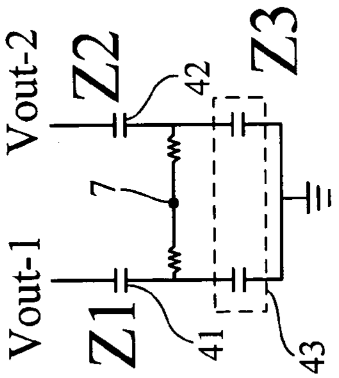
Figure 8F:
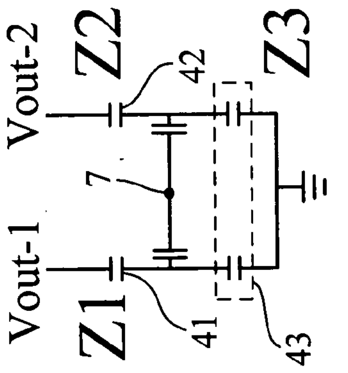

Besides, present invention is applicable in detecting anomaly associated with multiple tubes 31-N. In FIG. 7, the phase of first tube 31 is set to be opposite to that of second tube 32, and first impedance 41 and second impedance 42 couple with tube 31 and tube 32 respectively to form a detection point 7. The voltage value of detection point 7 is derived from the sum of the phase of first impedance 41 and the phase of second impedance 42, since the voltage value calculated under normal operation is approaching zero, when voltage-detecting protection circuit 5 detects a non-zero voltage at detection point 7, it is concluded that a tube anomaly is associated with tube 31-N.

FIGS. 8A–F illustrate difference configurations of first impedance 41, second impedance 42 and third impedance 43 of the present invention. As in FIG. 8A, first impedance 41, second impedance 42 and third impedance 43 comprises one or more than one capacitor, respectively; in FIG. 8B, third impedance 43 comprises a capacitor and a resistor connecting in shunt configuration; in FIG. 8C, first impedance 41, second impedance 42 and third impedance 43 comprise one or more than one resistor, respectively; in FIG. 8D, first impedance 41, second impedance 42 and third impedance 43 comprise one or more than one inductor, respectively; in FIG. 8E, first impedance 41, second impedance 42 and third impedance 43 are either capacitors or resistors, connected in a bridge mode; in FIG. 8F, first impedance 41, second impedance 42 and third impedance 43 are capacitors connected in a bridge mode. However, the above-mentioned capacitors can be constructed with two planar conductors using a printed circuit board as a medium.

The present invention provides a bridge type phase detection device, which compared with other prior art tube anomaly detection devices, is advantageous in:

1. In the present invention, the phase of the first tube is set to be opposite to that of the second tube; and the first, second, and third impedance are configured to be close to the impedance of the two tubes and to form a detection point. When a non-zero voltage is detected at the detection point, it is concluded that a tube anomaly is present, thereby improving the accuracy of the detection.

2. The present invention is suitable for detecting multiple tubes, wherein the first, second and third impedance can be resistor, capacitor or inductor.

Many changes and modifications in the above described embodiment of the invention can, of course, be carried out without departing from the scope thereof. Accordingly, to promote the progress in science and the useful arts, the invention is disclosed and is intended to be limited only by the scope of the appended claims.

What is claimed is:

1. A bridge type phase detection device comprises an electronic switch, a PWM IC, one or more than one transformer, a plurality of tubes, a voltage-detecting protection circuit and a first, second and third impedance; wherein a primary side of said transformer and said PWM IC coupling with said electronic switch, a secondary side of said transformer coupling with a first end of each one of said plurality of tubes, while a second end of each one of said plurality of tubes being grounded, and said voltage-detecting protection circuit coupling with said PWM IC;

said bridge type phase detection device is characterized in:

a first tube of said plurality of tubes has a phase opposite to that of a second tube of said plurality of tubes, and a first end of said first impedance coupling with said secondary side of said transformer and a first end of said first tube, a first end of said second impedance coupling with said secondary side of said transformer and a first end of said second tube, then a second end of said first impedance connecting to a second end of said second impedance to form a detection point, said detection point coupling with said third impedance and said voltage-detecting protection circuit; said detection point having a voltage value derived from calculating a sum of said phase of said first impedance and that of said second impedance, said voltage-detecting protection circuit detecting said detection point and obtaining approximately zero voltage at said detection point during normal operation, if said voltage-detecting protection circuit detecting a non-zero voltage, it is concluded that a tube anomaly is present.

2. The bridge type phase detection device of claim 1, wherein the number of transformers is equal to that of tubes.

3. The bridge type phase detection device of claim 1, wherein a single transformer is used to drive said plurality of tubes.

4. The bridge type phase detection device of claim 1, wherein said first impedance, second impedance, and third impedance comprise one or more than one capacitor, respectively.

5. The bridge type phase detection device of claim 1, wherein said first impedance, second impedance comprise capacitors, while said third impedance comprises a capacitor and a resistor connecting in shunt configuration.

6. The bridge type phase detection device of claim 1, wherein said first impedance, second impedance, and third impedance comprise one or more than one resistor, respectively.

7. The bridge type phase detection device of claim 1, wherein said first impedance, second impedance and third impedance comprise one or more than one inductor, respectively.

8. The bridge type phase detection device of claim 1, wherein said first impedance, second impedance and third impedance are either capacitors or resistors, connected in a bridge mode.

9. The bridge type phase detection device of claim 1, wherein said first impedance, second impedance and third impedance are capacitors connected in a bridge mode.

10. The bridge type phase detection device of claim 1, wherein said tube is a U-shaped tube.

* * * * *